United States Patent
Kim et al.

(10) Patent No.: US 9,231,228 B2
(45) Date of Patent: Jan. 5, 2016

(54) ANODE CONTAINING METAL OXIDE AND ORGANIC LIGHT EMITTING DEVICE HAVING THE SAME

(75) Inventors: Won-Jong Kim, Yongin-si (KR); Joon-Gu Lee, Yongin-si (KR); Ji-Young Choung, Yongin-si (KR); Jin-Baek Choi, Yongin-si (KR); Yeon-Hwa Lee, Yongin-si (KR); Chang-Ho Lee, Yongin-si (KR); Il-Soo Oh, Yongin-si (KR); Hyung-Jun Song, Yongin-si (KR); Jin-Young Yun, Yongin-si (KR); Young-Woo Song, Yongin-si (KR); Jong-Hyuk Lee, Yongin-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 207 days.

(21) Appl. No.: 13/299,543

(22) Filed: Nov. 18, 2011

(65) Prior Publication Data
US 2012/0326190 A1    Dec. 27, 2012

(30) Foreign Application Priority Data

Jun. 23, 2011   (KR) .................... 10-2011-0060941

(51) Int. Cl.
    *H01L 51/52*      (2006.01)
(52) U.S. Cl.
    CPC .................... *H01L 51/5218* (2013.01)
(58) Field of Classification Search
    None
    See application file for complete search history.

(56) References Cited

U.S. PATENT DOCUMENTS

| | | | |
|---|---|---|---|
| 2001/0026714 A1* | 10/2001 | Uezono et al. | 399/264 |
| 2006/0091791 A1 | 5/2006 | Shin | |
| 2006/0204788 A1* | 9/2006 | Yoshikawa | 428/690 |
| 2006/0263593 A1* | 11/2006 | Aziz et al. | 428/328 |
| 2006/0279190 A1* | 12/2006 | Nakayama | 313/113 |
| 2008/0051607 A1* | 2/2008 | Ichimura et al. | 564/393 |
| 2009/0096358 A1 | 4/2009 | Lee | |
| 2009/0140251 A1* | 6/2009 | Yamazaki | 257/57 |
| 2009/0236590 A1* | 9/2009 | Ohsawa | 257/40 |
| 2011/0121351 A1* | 5/2011 | Lee et al. | 257/99 |
| 2011/0193107 A1 | 8/2011 | Takeuchi | |
| 2012/0216870 A1* | 8/2012 | So et al. | 136/263 |
| 2013/0313543 A1* | 11/2013 | Ohuchi et al. | 257/40 |

FOREIGN PATENT DOCUMENTS

| | | |
|---|---|---|
| CN | 1780022 A | 5/2006 |
| CN | 101409330 A | 4/2009 |
| KR | 1020050086413 A | 8/2005 |
| KR | 1020110001854 A | 1/2011 |

(Continued)

OTHER PUBLICATIONS

Computation from examiner in reference to claims 7 and 25. 2013.*

(Continued)

*Primary Examiner* — Whitney T Moore
*Assistant Examiner* — Scott R Wilson
(74) *Attorney, Agent, or Firm* — Robert E. Bushnell, Esq.

(57) ABSTRACT

An anode for an organic light emitting device which introduces a metal oxide to improve flows of charges, and an organic light emitting device using the anode. The anode for the organic light emitting device has excellent charge injection characteristics, thereby improving power consumption of the organic light emitting device.

32 Claims, 4 Drawing Sheets

(56) References Cited

FOREIGN PATENT DOCUMENTS

| WO | WO 2011024331 A1 | 3/2011 |
| WO | WO 2011-056778 A2 | 5/2011 |

OTHER PUBLICATIONS

Hermann, "Properties and identification of oxygen sites at the V2O5(010) surface: theoretical cluster studies and photemission experiments", Elsevier, Journal of Electron Spectroscopy, 98-99 (1999) 245-256.*

So, Organic Electronics, 2010, CRC Press, p. 81.*

Chemical Forum http://chemicalforum.webqc.org. CAS identifier number of 2-TNATA. 2013.*

LookChem.com. Basic Information for CAS No. 185690-41-9. 2013.*

Examiner Notes on calcualtion of weight percentage. 2013.*

CRC Handbook of Chemistry and Physics 95th edition, Physical Properties of Inorganic Compounds, p. 4-97, tungsten oxide, 2014.*

AZOM.com, Indium Tin Oxide (ITO)—Properties and Applications, http://www.azom.com/article.aspx?ArticleID=2349, 2000.*

Mass Spectroscopy, Inghram and Hayden, National Academies of Sciences, p. 31, 1954. http://books.google.com/books?id=o7wrAAAAYAAJ&Ipg=PA31&ots=ve-HCdZSeW&dq=work%20function%20tungsten%20oxide&pg=PP4#v=onepage&q=work%20function%20tungsten%20oxide&f=false.*

Calculation of weight percentage, Scott Wilson, 2014.*

Prociow et al., Electrical and Optical Study of Transparent V-based Oxide Semiconductors Prepared by Magnetron Sputtering under Different Conditions, Radioengineering, vol. 20, No. 1, pp. 204-208, Apr. 2011.

Chinese Office Action issued by Chinese Patent Office on Jul. 3, 2015 in connection with Chinese Patent Application No. 201210162665.3 which also claims Korean Patent Application No. KR 10-2011-0060941 as its priority document.

* cited by examiner

ANODE CONTAINING METAL OXIDE AND ORGANIC LIGHT EMITTING DEVICE HAVING THE SAME

CLAIM OF PRIORITY

This application makes reference to, incorporates the same herein, and claims all benefits accruing under 35 U.S.C. §119 from an application earlier filed in the Korean Intellectual Property Office on the 23 of Jun. 2011 and there duly assigned Serial No. 10-2011-0060941.

BACKGROUND OF THE INVENTION

1. Field of the Invention

The present invention relates to an anode containing metal oxides and an organic light emitting device having the same, and more particularly to an anode adapted to improve hole injection characteristics and power consumption and an organic light emitting device using the same.

2. Description of the Related Art

In recent years, display apparatuses are being replaced by portable flat panel display apparatuses which are thin and slim. Light emitting devices of the flat panel display apparatuses are emissive display devices, which are coming into the spotlight due to their wide angles of view, excellent contrasts, and quick responses. Particularly, the organic light emitting devices where light emitting layers are made of organic materials are getting the spotlight owing to their excellent luminance, drive voltages, and response speeds, and realization of various colors.

SUMMARY OF THE INVENTION

Accordingly, the present invention has been made to solve the above-mentioned problems occurring in the prior art, and an aspect of the present invention provides an anode for an organic light emitting device which shows excellent reflection characteristics and excellent hole injecting characteristics.

Another aspect of the present invention provides an organic light emitting device which employs the above-mentioned anode.

In particular, the present invention provides an anode for an organic light emitting device which improves hole injecting characteristics by increasing the work function of an organic light emitting device, and an organic light emitting device having the anode.

According to an exemplary embodiment of the present invention, there is provided an anode for an organic light emitting device containing a metal oxide.

The anode for an organic light emitting device may include a metal layer and a transparent conductive layer formed on the metal layer. Here, the transparent conductive layer contains a transparent conductive oxide (TCO) and a metal oxide. In the present invention, the transparent conductive oxide is simply referred to as "TCO".

According to another example of the present invention, the metal layer contains silver (Ag). Silver (Ag) has an excellent conductivity and excellent reflection characteristics, so it can be applied to a reflective electrode.

According to another example of the present invention, a thickness of the metal layer is set to approximately 500 Å to approximately 3000 Å, and preferably approximately 500 Å to approximately 1500 Å. As a thickness of the metal layer becomes thicker, conduction characteristics, charge injection characteristics, and reflection characteristics become excellent. However, in order to make the device slim, it is preferable to make a thickness of the metal layer thin. Thus, considering conduction and reflection characteristics and slimness of the device, a thickness of the metal layer is set to approximately 500 Å to approximately 3000 Å, and preferably approximately 500 Å to approximately 1500 Å.

According to another embodiment of the present invention, a thickness of the transparent conductive layer is set to approximately 50 Å to approximately 150 Å.

The transparent conductive layer serves to complement a work function of the metal layer. Considering slimness of the device and a work function complementing function, a thickness of the transparent conductive layer is set to approximately 50 Å to approximately 150 Å.

Examples of the transparent conductive oxide include ITO, AZO, IGO, GIZO, IZO, and $ZnO_x$. They may be one or a mixture of two substances. In addition to the above-mentioned materials, any oxide which is transparent and conductive may be applied to the transparent conductive oxide without any limitation.

The metal oxide is an oxide containing at least one selected from a group consisting of Ni, Co, V, W, and Yb, and especially includes NiO, $Co_2O_3$, and YbO. They may be one or a mixture of two substances.

For example, a transparent conductive oxide, i.e. ITO may be mixed with a metal oxide, e.g. NiO and $Co_2O_3$. Then, the transparent conductive layer may be formed by sputtering ITO and NiO—$Co_2O_3$. In addition to the above-mentioned materials, other materials having high work functions may be applied.

According to another embodiment of the present invention, a work function of the transparent conductive layer may be set to approximately 4.8 eV to approximately 6.5 eV.

According to another example of the present invention, a content of the metal oxide contained in the transparent conductive layer is approximately 3 wt % to approximately 15 wt % of the total weight of the transparent conductive layer, and a work function of the metal oxide is approximately 5.0 eV to approximately 6.5 eV. Here, a content of the metal oxide is set so that a work function of the transparent conductive layer is approximately 4.8 eV to approximately 6.5 eV. Meanwhile, if the amount of doped metal oxide is small, its effect cannot be expected. On the other hand, if an amount of doped metal oxide is large, optical characteristics deteriorate.

According to another embodiment of the present invention, in the transparent conductive layer, the transparent conductive oxide may form a matrix and the metal oxide may be doped into the matrix formed of the transparent conductive oxide.

According to another embodiment of the present invention, the transparent conductive layer may be formed through sputtering or deposition where the transparent conductive oxide and the metal oxide are used as raw materials.

According to another embodiment of the present invention, the transparent conductive layer may have a structure where a thin film formed of the metal oxide is disposed on a thin film formed of the transparent conductive oxide. According to another embodiment of the present invention, a thickness of the thin film formed of the metal oxide is approximately 5 Å to approximately 50 Å. A thickness of the thin film formed of the transparent conductive oxide is approximately 45 Å to approximately 100 Å.

According to another embodiment of the present invention, the anode is a reflective electrode of the organic light emitting device.

The present invention also provides a method of manufacturing an anode for an organic light emitting device.

The method includes the steps of forming a metal layer on a substrate, and forming a transparent conductive layer on the metal layer. Here, the step of forming a transparent conductive layer is performed through sputtering or deposition where a transparent conductive oxide and a metal oxide are used as raw materials.

According to another embodiment of the present invention, the step of forming a transparent conductive layer includes the steps of forming a thin film formed of the transparent conductive oxide on the metal layer using the transparent conductive oxide, and forming a thin film formed of the metal oxide on the thin film formed of the transparent conductive oxide.

According to another embodiment of the present invention, in the step of forming a transparent conductive layer, the transparent conductive oxide and the metal oxide are simultaneously sputtered or deposited so that the transparent conductive oxide forms a matrix and the metal oxide is doped into the matrix formed by the transparent conductive oxide.

The present invention provides an organic light emitting device including the above-mentioned anode.

The organic light emitting device includes a substrate, a first electrode formed on the substrate, an organic layer formed on the first electrode, and a second electrode formed on the organic layer. Here, the organic layer includes at least one layer including a light emitting layer. One of the first electrode and the second electrode includes a metal layer and a transparent conductive layer formed on the metal layer. The transparent conductive layer contains a transparent conductive oxide and a metal oxide.

In the organic light emitting device according to the present invention, the anode including the metal layer and the transparent conductive layer formed on the metal layer is as described above.

According to another example of the present invention, the anode including the metal layer and the transparent conductive layer formed on the metal layer is a first electrode.

According to another example of the present invention, the anode including the metal layer and the transparent conductive layer formed on the metal layer may be the first electrode formed on the substrate, which may serve as a reflective electrode.

The anode for an organic light emitting device according to the present invention enables charges to be injected excellently, and a light emitting efficiency of an organic light emitting device can be increased by employing the anode. Further, when the anode for an organic light emitting device is used in a reflective way, reflection characteristics can become more excellent. Furthermore, a work function of the organic light emitting device can be increased by introducing the above-mentioned anode in the organic light emitting device, making it possible to improve hole injecting characteristics and reduce power consumption.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
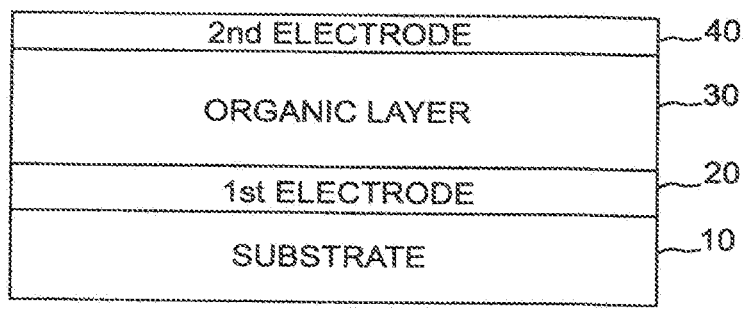
FIG. 1 is a schematic view illustrating a general structure of an organic light emitting device.

Hereinafter, exemplary embodiments of the present invention will be described with reference to the accompanying drawings. However, it should be noted that the scope of the present invention is not limited by the below-described embodiments and the drawings.

Meanwhile, although the elements and their shapes are simplified or exaggerated in the drawings to help understanding of the present invention, the same reference numerals are used to designate the same or similar components.

Also, when it is described that a layer is located on another layer or a substrate, it means that a layer may be disposed to directly contact another layer or a substrate or a third layer may be interposed between them.

A light emitting device is a device that uses light generated when electrons are coupled to holes to cause a radiative decay.

The light emitting device basically includes an electrode (anode) for injection of holes, another electrode (cathode) for injection of electrons, and light emitting layers stacked between the electrode for injecting holes and the electrode for injecting electrons. Electrons are injected at a cathode of the light emitting device and holes are injected at an anode thereof, so that after charges move in opposite directions under the influence of external electric fields, they are coupled in a light emitting layer, causing a radiative decay and emitting light. A light emitting device having a light emitting layer formed of a single molecule organic material or a polymer is particularly referred to as an organic light emitting device.

Typically, an anode, i.e. an electrode for injection of holes, is made of an electrode material, such as gold (Au) or indium-tin-oxide (ITO), whose work function is large, and a cathode, i.e. an electrode for injection of electrons, is made of an electrode material, such as magnesium (Mg) or lithium (Li), whose work function is small.

Meanwhile, in a light emitting device, a hole transport layer may be introduced between an anode and a light emitting layer to reinforce transport of a hole and an electron transport layer may be introduced between a cathode and a light emitting layer to reinforce transport of an electron. Organic materials are mainly used for the hole transport layer, the light emitting layer, and the electron transport layer in an organic light emitting device. In particular, a material having the property of a p-type semiconductor is used as the hole transport layer and a material having the property of an n-type semiconductor is used as the electron transport layer.

FIG. 1 is a schematic view illustrating an organic light emitting device.

Referring to FIG. 1, the organic light emitting device basically has a structure where a first electrode 20 is formed on a substrate 10, an organic layer 30 is disposed on the first electrode 20, and a second electrode 40 is disposed on the organic layer 30, the organic layer 30 being disposed between the first electrode 20 and the second electrode 40. The organic layer 30 includes a light emitting layer where holes and electrons are coupled to each other to cause a radiative decay. One of the first electrode 20 and the second electrode 40 is an anode for injection of holes and the other is a cathode for injection of electrons.

Figure 2:
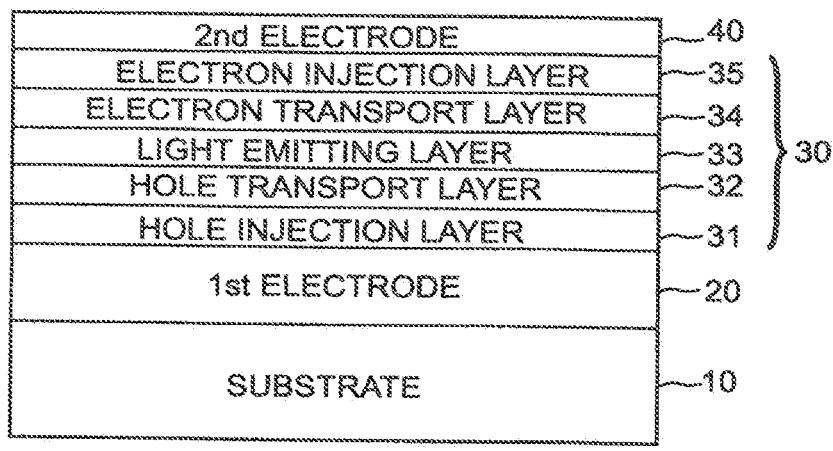
FIG. 2 is a schematic view illustrating a structure of an organic layer of the organic light emitting device of FIG. 1 in more detail.

FIG. 2 illustrates the organic light emitting device including the organic layer 30 having a multilayered stack structure. When the first electrode 20 is an anode, the organic layer 30 sequentially includes a hole injecting layer 31, a hole transport layer 32, a light emitting layer 33, an electron transport layer 34, and an electron injecting layer 35 from the first electrode 20. On the other hand, when the second electrode 40 is an anode, the organic layer 30 sequentially includes a hole injecting layer 35, a hole transport layer 34, a light emitting layer 33, an electron transport layer 32, and an electron injecting layer 31 from the second electrode 40.

For reference, since the electron injecting layer is often made of metal elements other than an organic material or a composite thereof, it is excluded from the organic layer and may be classified as a separate layer or may be included in a cathode.

The efficiency of such an organic light emitting device is generally determined by its light emitting efficiency. Thus, various efforts and attempts have been suggested to increase the light emitting efficiency of an organic light emitting device.

The light emitting efficiency of an organic light emitting device is influenced by the easiness of injection of electrons and holes, formation of singlet exitons, light emitting locations, and use of triplet exitons. Thus, in order to enhance the light emitting efficiency of an organic light emitting device, an electron injecting layer and a hole injecting layer are inserted between electrodes and a light emitting layer to easily inject charges. The work functions of electrodes are made suitable for the highest occupied molecular orbital (HOMO) level and lowest unoccupied molecular orbital (LUMO) level of a light emitting layer to easily inject charges. Alternatively, an organic material containing heavy elements are added to a light emitting layer to covert triplet exitons causing a non-radiative decay to singlet exitons causing radiative decay. However, these methods have a limit in the aspect of stability of devices.

Meanwhile, the light emitting efficiency of an organic light emitting device may be increased by enhancing the reflection factor of an electrode opposite to a light emitting surface of the organic light emitting device. In more detail, an electrode on a light emitting surface of the light emitting device may be constituted by a transparent electrode and another electrode situated on the opposite side of the light emitting surface is constituted by a reflective electrode, so that the reflective electrode can reflect and emit the light generated in the light emitting layer and radiating to the opposite side of the light emitting surface to increase light emitting efficiency.

Examples of such a reflective electrode include a reflective electrode realized by a metal layer. Meanwhile, if the metal layer is used as an electrode as it is, charges are occasionally not injected easily. In particular, when a reflective electrode constituted by a metal layer is used as an anode, hole injecting efficiency may be reduced.

Figure 3:
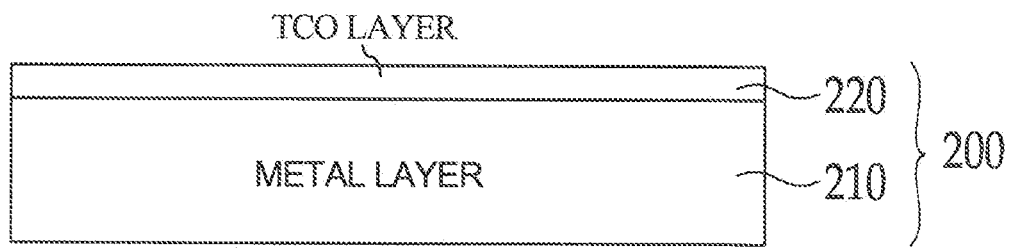
FIG. 3 is a schematic view illustrating an example of a structure of an anode for an organic light emitting device.

In order to improve a disadvantage of using an electrode constituted only by a metal layer as an anode, a stack stricture where a transparent conductive oxide (TCO) material or other inorganic materials are disposed together on a metal layer has been studied. A TCO material such as ITO has a high transparency and a high processing property and its work function can be easily regulated, for example, through plasma processing, so it is widely used. FIG. 3 illustrates an example of an anode 200 having a structure where a thin film (TCO layer) 220 formed of a transparent conductive oxide material such as ITO is formed on a metal layer 210 made of silver.

Meanwhile, since there exists an energy barrier when charges are injected from an anode to an organic material, it is advantageous if the work function of the anode increases. In recent years, since the work function of silver (Ag), which is widely used as an anode reflective electrode, is merely 4.0 to 4.3 eV, ITO having a work function of 4.8 eV is used to facilitate injection of charges as well as protection of a metal layer. If work function increases to more than 5.0 eV, hole injecting characteristics are improved, making it possible to lower drive voltage and power consumption. However, the work function of the ITO widely used currently is below 5.0.

Figure 4:
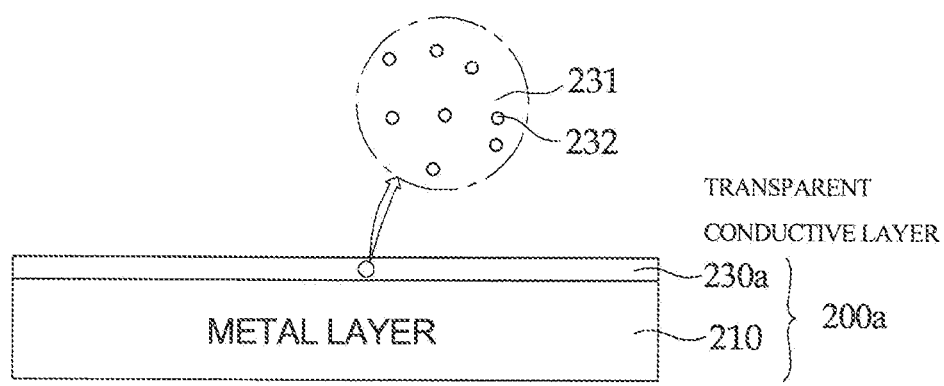
FIG. 4 is a schematic view illustrating a structure of an anode for an organic light emitting device according to an embodiment according to the principles of the present invention.

FIG. 4 schematically illustrates an anode 200a for an organic light emitting device containing a metal oxide constructed as an embodiment according to the principles of the present invention. Here, the anode 200a for an organic light emitting device includes a metal layer 210 and a transparent conductive layer 230a formed on the metal layer 210. The transparent conductive layer 230a contains a transparent conductive oxide 231 and a metal oxide 232.

In the transparent conductive layer 230a of the anode 200a for an organic light emitting device of FIG. 4, the metal oxide 232 is doped into a matrix formed of the transparent conductive oxide 231.

Figure 5:
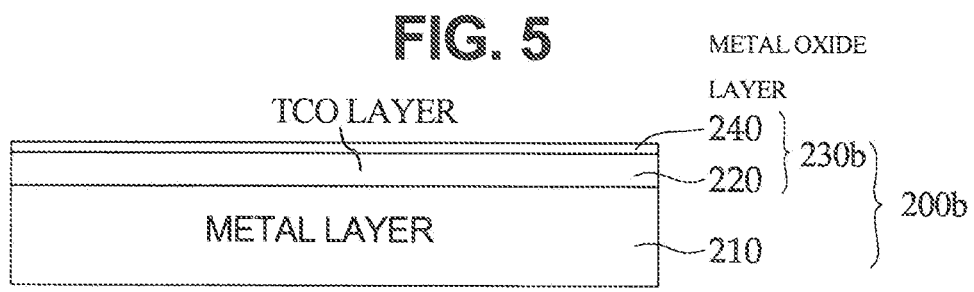
FIG. 5 is a schematic view illustrating a structure of an anode for an organic light emitting device according to another embodiment according to the principles of the present invention.

FIG. 5 illustrates an anode 200b for an organic light emitting device constructed as another embodiment according to the principles of the present invention. The anode 200b for an organic light emitting device includes a metal layer 210 and a transparent conductive layer 230b formed on the metal layer 210. In a structure of the transparent conductive layer 230b of FIG. 5, a thin film 240 formed of a metal oxide is formed on a top surface of a thin film 220 formed of the transparent conductive oxide.

Referring to FIGS. 4 and 5, the transparent conductive layer may be formed through sputtering or deposition where the transparent conductive oxide 231 and the metal oxide 232 are used as raw materials.

In more detail, the anode 200a or 200b for an organic light emitting device according to the present invention may be manufactured by forming a metal layer 210 on a substrate and a transparent conductive layer 230a or 230b on the metal layer 210. Here, the substrate may be a substrate of an organic light emitting device, or may be separately prepared to manufacture an electrode. Meanwhile, sputtering or deposition may be applied to form the transparent conductive layer.

According to the example of FIG. 4, a transparent conductive oxide and a metal oxide may be simultaneously sputtered or deposited to form the transparent conductive layer. In more detail, when co-deposition is performed by simultaneously using a transparent conductive oxide and a metal oxide, a deposition layer where the transparent conductive oxide and the metal oxide are mixed is formed. Likewise, sputtering is performed by simultaneously using the transparent conductive oxide and the metal oxide, a sputtering layer where the transparent conductive oxide and the metal oxide are mixed is formed. After the co-deposition and sputtering, a matrix is formed by the transparent conductive oxide 231 and a structure 230a where the metal oxide 232 is doped into the matrix formed by the transparent conductive oxide 231 is formed. The anode 200a formed in this way has a structure of FIG. 4.

According to the example of FIG. 5, in the step of forming the transparent conductive layer 230b, a thin film 220 formed of a transparent conductive oxide may be first formed on the metal layer 210 using the transparent conductive oxide 231, and then a thin film 240 formed of a metal oxide may be formed on a surface of the thin film 220 formed of the transparent conductive oxide. The anode 200b formed in this way has a structure of FIG. 5. Sputtering or deposition may be applied to form the thin film 220 formed of the transparent conductive oxide and the thin film 240 formed of the metal oxide.

According to the example of FIG. 5, a thickness of the thin film 240 formed of the metal oxide may be approximately 5 Å to approximately 50 Å and a thickness of the thin film 220 formed of the transparent conductive oxide may be approximately 45 Å to approximately 100 Å.

An existing anode used as a reflective film of an organic light emitting device cannot be used independently due to a low stability of a metal, so it has been used mainly in a stack structure together with a thin film formed of a TCO material or other inorganic materials. Among them, ITO is widely used because it has a relatively high transparency and an excellent processing property and can easily set a work function through plasma processing. It is because as a work function of an anode becomes high, charges can be smoothly injected, making it possible to enhance drive characteristics.

Figure 6:
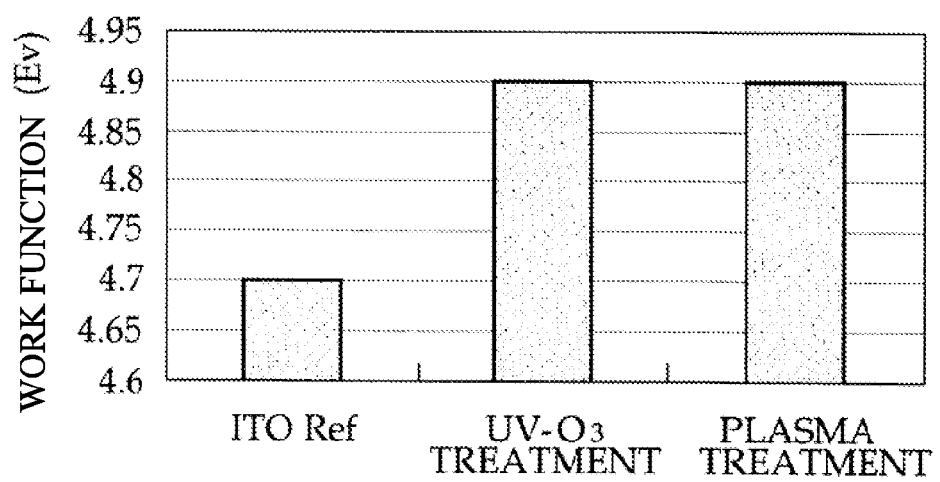
FIG. 6 is a graph illustrating work functions of ITO anodes obtained when their surfaces are processed.

However, as can be seen in FIG. 6, a conventional anode 200 of FIG. 3 employing a thin film 220 formed of a transparent conductive oxide containing pure ITO has a low work function (4.7 eV). Even if UV-ozone processing and plasma processing are performed to an ITO surface, work function increases to a degree but a work function of more than 5.0 eV cannot be obtained.

Figure 7:
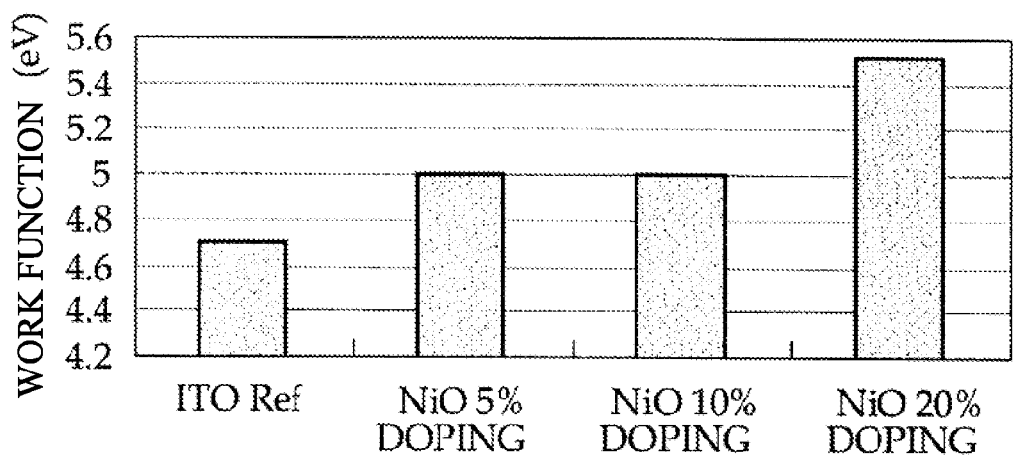
FIG. 7 is a graph illustrating work functions of an ITO anode, and anodes of the present invention obtained by doping the ITO anode with a metal oxide.

To the contrary, it can be seen from FIG. 7 that in an anode for an organic light emitting device according to the present invention where NiO is doped into a thin film 230a formed of a transparent conductive oxide as the example of FIG. 4, work function can increase to 5.5 eV (NiO 20% doping).

Although not illustrated in the drawings, it can be seen that in an anode for an organic light emitting device according to the present invention where $Co_2O_3$ is doped into a thin film 230a formed of a transparent conductive oxide, work function can increase up to 5.9 eV ($Co_2O_3$ 30% doping).

That is, in the anode for an organic light emitting device according to the present invention, a metal oxide having a high work function may be introduced into a thin film formed of a transparent conductive oxide to allow charges to be smoothly injected into a light emitting layer, accordingly reducing drive voltage and power consumption.

According to another example of the present invention, the metal layer 210 contains silver (Ag). Silver (Ag) has a high conductivity and an excellent reflection characteristic. Thus, the anode having a metal layer containing silver (Ag) may be applied to a reflective electrode.

According to an example of the present invention, a thickness of the metal layer 210 may be set to approximately 500 Å to approximately 3000 Å, and preferably approximately 500 Å to approximately 1500 Å. As a thickness of a metal layer grows thicker, charge injecting characteristics and reflection characteristics become more excellent due to its good conduction characteristics. However, a thickness of the metal layer should be thin to make the device slim. Accordingly, a thickness of the metal layer is set to approximately 500 Å to approximately 3000 Å, and preferably approximately 500 Å to approximately 1500 Å.

According to another example of the present invention, a thickness of the transparent conductive layer 230a or 230b is set to approximately 50 Å to approximately 150 Å. The transparent conductive layer 230a or 230b serves to compensate for a work function of the metal layer 210. Accordingly, a thickness of the transparent conductive layer 230a or 230b is set to approximately 50 Å to approximately 150 Å, considering the slimness of the device and compensation of work function.

The transparent conductive oxide contained in the transparent conductive layer 230a or 230b includes, for example, ITO, AZO, IGO, GIZO, IZO, and $ZnO_x$. Here, the transparent conductive oxide may be selected from those used in a conventional transparent electrode, but may be purchased by those skilled in the art. They may be used independently or at least two of them may be mixed to be used. In addition to the above-mentioned materials, any oxide which is both transparent and conductive may be applied to the transparent conductive oxide without any restriction.

The metal oxide contained in the transparent conductive layer 230a or 230b includes, for example, Ni, Co, V, W, and Yb. In particular, NiO, $Co_2O_3$, and YbO may be used as the metal oxide. Here, any metal oxide whose work function is 5.0 eV to 6.5 eV may be used as the metal oxide. They may be used independently or at least two of them may be mixed to be used.

For example, NiO and $Co_2O_3$, i.e. metal oxides may be mixed with ITO, i.e. a transparent conductive oxide to be used. The transparent conductive layer may be formed by sputtering ITO and NiO—$Co_2O_3$. It is apparent that any material having a high work function other than the above-mentioned materials may be applied.

According to another example of the present invention, a work function of the transparent conductive layer 230a or 230b may be set to approximately 4.8 eV to approximately 6.5 eV.

According to another example of the present, a content of the metal oxide contained in the transparent conductive layer is approximately 3 wt % to approximately 15 wt % of the total weight of the transparent conductive layer, and a work function of the metal oxide is approximately 5.0 eV to approximately 6.5 eV. Here, a content of the metal oxide may be set so that a work function of the transparent conductive layer is 4.8 eV to 6.5 eV.

According to another example of the present invention, the above-mentioned anode has an excellent reflection characteristic. Thus, the anode may be applied as a reflective electrode of the organic light emitting device.

The method of manufacturing an anode for an organic light emitting device according to the present invention is as discussed above.

The present invention provides an organic light emitting device including the anode.

The organic light emitting device according to another example of the present invention includes a substrate 10, a first electrode 20 formed on the substrate 10, an organic layer 30 formed on the first electrode 20, and a second electrode 40 formed on the organic layer 30 (see FIG. 1).

Here, the organic layer 30 includes at least one layer including a light emitting layer 33 (refer to FIG. 2). According to another embodiment of the present invention, the organic layer 30 sequentially includes a hole injecting layer, a hole transport layer, a light emitting layer, an electron transport layer, and an electron injecting layer from the anode. If the first electrode is an anode when seen FIG. 2, then the organic layer 30 sequentially includes a hole injecting layer 31, a hole transport layer 32, a light emitting layer 33, an electron transport layer 34, and an electron injecting layer 35 from the first electrode. On the other hand, when the second electrode is an anode, the organic layer 30 sequentially includes a hole injecting layer 35, a hole transport layer 34, a light emitting layer 33, an electron transport layer 32, and an electron injecting layer 31 from the second electrode.

In the organic light emitting device according to an example of the present invention, one of the first electrode and the second electrode is the anode 200a including the metal layer 210 and the transparent conductive layer 230a formed on the metal layer 210 (refer to FIG. 4). Here, the transparent conductive layer 230a contains a transparent conductive oxide 231 and a metal oxide 232, which has been described above.

According to another example of the present invention, the anode 200b including the metal layer 210 and the transparent conductive layer 230b formed on the metal layer 210 may be the first electrode 20 (refer to FIG. 4). In this case, the anode 200b including the metal layer 210 and the transparent conductive layer 230b formed on the metal layer 210 may have the function of the reflective electrode as the first electrode 20 formed on the substrate.

In more detail, as a first embodiment of the present invention, a transparent conductive layer 230a is formed by using silver (Ag) to form a metal layer 210 on a glass substrate 10 and forming an ITO film 230a doped with a small amount of NiO (doping weight ratio NiO:ITO=10:90) and having a thickness of 70 Å on the metal layer 210. The electrode including the metal layer 210 and the transparent conductive layer 230a is used as an anode 200a.

In the first embodiment of the present invention, after a hole injecting layer, a hole transport layer, alight emitting layer, an electron transport layer, and an electron injecting layer are sequentially formed on the anode 200a, a MgAg layer is formed as a cathode to manufacture a green OLED device.

A second embodiment of the present invention is the same as the first embodiment of the present invention except that a transparent conductive layer 230a is formed by forming an ITO film 230a doped with a small amount of NiO (doping weight ratio NiO:ITO=15:85) and having a thickness of 70 Å.

A comparison example is the same as the first embodiment of the present invention except that a green OLED device is manufactured using a film 220 having a thickness of 70 Å which is obtained by forming pure ITO which does not have contain a metal oxide on a metal layer 210 formed of silver (Ag) as an anode 200.

Figure 8:
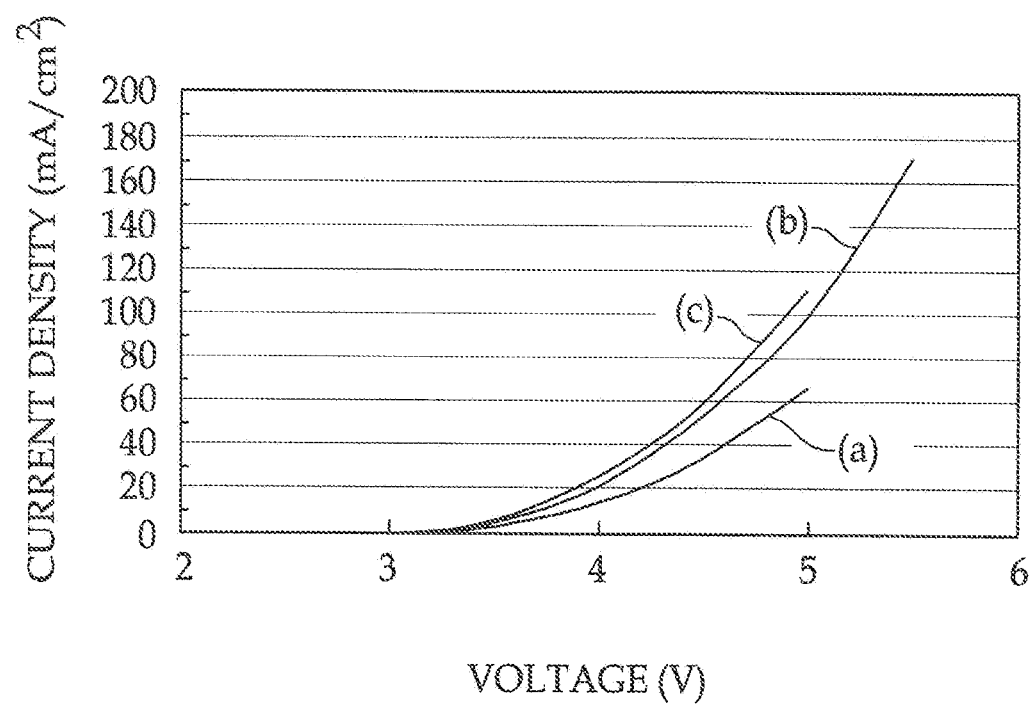
FIG. 8 is a graph illustrating a result obtained by measuring current densities according to voltages in organic light emitting devices manufactured through the embodiments of the present invention and the comparison examples.

The measurement results obtained by measuring current densities according to voltages in green OLED devices manufactured according to the embodiments and the comparison example are illustrated in FIG. 8. In FIG. 8, the line (a) indicates the comparison example, the line (b) indicates the first embodiment, and the line (c) indicates the second embodiment.

FIG. 8 shows that current density has been enhanced. It shows that when work function increases in an anode, injection characteristics are improved and charges flow more excellently. That is, it can be seen that the efficiency of the device has been improved.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An anode for an organic light emitting device, comprising:
   a metal layer; and
   a transparent conductive layer formed on the metal layer,
   the transparent conductive layer consisting essentially of a transparent conductive oxide (TCO) and a metal oxide, a metal of the metal oxide being other than the metal for the transparent conductive oxide,
   the metal oxide having a content of essentially 3 wt % to essentially 15 wt % of the total weight of the transparent conductive layer, and
   the metal oxide having a work function higher than a work function of the transparent conductive oxide.

2. The anode as claimed in claim 1, the metal layer containing silver (Ag).

3. The anode as claimed in claim 1, the metal layer having a thickness of approximately 500 Å to approximately 3000 Å.

4. The anode as claimed in claim 1, the transparent conductive layer having a thickness of approximately 50 Å to approximately 150 Å.

5. The anode as claimed in claim 1, the transparent conductive oxide comprising at least one selected from the group consisting of ITO, AZO, IGO, GIZO, IZO, and ZnOx.

6. The anode as claimed in claim 1, the metal oxide being an oxide of at least one metal selected from the group consisting of Ni, Co, V, W, and Yb.

7. The anode as claimed in claim 1, the metal oxide having a work function of approximately 5.0 eV to approximately 6.5 eV.

8. The anode as claimed in claim 1, the transparent conductive layer having a work function of approximately 4.8 eV to approximately 6.5 eV.

9. The anode as claimed in claim 1, the transparent conductive oxide forming a matrix within the transparent conductive layer, the metal oxide being doped into the matrix formed of the transparent conductive oxide.

10. The anode as claimed in claim 9, the transparent conductive layer being formed through one of sputtering and deposition, where the transparent conductive oxide and the metal oxide are used as raw materials.

11. The anode as claimed in claim 1, the transparent conductive layer comprising a thin film formed of the metal oxide disposed on a thin film formed of the transparent conductive oxide.

12. The anode as claimed in claim 11, the thin film formed of the metal oxide having a thickness of from approximately 5 Å to approximately 50 Å.

13. The anode as claimed in claim 11, the thin film formed of the transparent conductive oxide having a thickness of from approximately 45 Å to approximately 100 Å.

14. The anode as claimed in claim 1, the anode comprising a reflective electrode.

15. A method of manufacturing an anode for an organic light emitting device, comprising steps of:
   forming a metal layer on a substrate; and
   forming a transparent conductive layer on the metal layer,
   the step of forming a transparent conductive layer comprising a sputtering or deposition step where a transparent conductive oxide and a metal oxide a metal of the metal oxide being other than the metal for the transparent conductive oxide are used as raw materials,
   the metal oxide having a content of essentially 3 wt % to essentially 15 wt % of the total weight of the transparent conductive layer, and
   the metal oxide having a work function higher than a work function of the transparent conductive oxide.

16. The method as claimed in claim 15, the step of forming a transparent conductive layer comprising steps of:
- forming a thin film formed of the transparent conductive oxide on the metal layer using the transparent conductive oxide; and
- forming a thin film formed of the metal oxide on the thin film formed of the transparent conductive oxide.

17. The method as claimed in claim 15, the step of forming a transparent conductive layer further comprising simultaneously sputtering or depositing the transparent conductive oxide and the metal oxide so that the transparent conductive oxide forms a matrix and the metal oxide is doped into the matrix formed by the transparent conductive oxide.

18. An organic light emitting device, comprising:
- a substrate;
- a first electrode formed on the substrate;
- an organic layer formed on the first electrode, and
- a second electrode formed on the organic layer,
- the organic layer including at least one layer including a light emitting layer,
- one of the first electrode and the second electrode comprising an anode including a metal layer and a transparent conductive layer formed on the metal layer,
- the transparent conductive layer consisting essentially of a transparent conductive oxide and a metal oxide, a metal of the metal oxide being other than the metal for the transparent conductive oxide, and
- the metal oxide having a content of essentially 3 wt % to essentially 15 wt % of the total weight of the transparent conductive layer, and
- the metal oxide having a work function higher than a work function of the transparent conductive oxide.

19. The light emitting device as claimed in claim 18, the metal layer containing silver (Ag).

20. The light emitting device as claimed in claim 18, the metal layer having a thickness of approximately 500 Å to approximately 3000 Å.

21. The light emitting device as claimed in claim 18, the transparent conductive layer having a thickness of approximately 50 Å to approximately 150 Å.

22. The light emitting device as claimed in claim 18, the transparent conductive oxide comprising at least one selected from the group consisting of ITO, AZO, IGO, GIZO, IZO, and ZnOx.

23. The light emitting device as claimed in claim 18, the metal oxide being an oxide of at least one metal selected from the group consisting of Ni, Co, V, W, and Yb.

24. The light emitting device as claimed in claim 18, the metal oxide having a work function of from approximately 5.0 eV to approximately 6.5 eV.

25. The light emitting device as claimed in claim 18, the transparent conductive layer having a work function of from approximately 4.8 eV to approximately 6.5 eV.

26. The light emitting device as claimed in claim 18, the transparent conductive oxide in the transparent conductive layer forming a matrix, the metal oxide being doped into the matrix formed of the transparent conductive oxide.

27. The light emitting device as claimed in claim 26, the transparent conductive layer being formed through sputtering or deposition where the transparent conductive oxide and the metal oxide are used as raw materials.

28. The light emitting device as claimed in claim 18, the transparent conductive layer comprising a thin film formed of the metal oxide disposed on a thin film formed of the transparent conductive oxide.

29. The light emitting device as claimed in claim 28, the thin film formed of the metal oxide having a thickness of from approximately 5 Å to approximately 50 Å.

30. The light emitting device as claimed in claim 28, the thin film formed of the transparent conductive oxide having a thickness of from approximately 45 Å to approximately 100 Å.

31. The light emitting device as claimed in claim 18, the electrode including the metal layer and the transparent conductive layer formed on the metal layer being a reflective electrode.

32. The light emitting device as claimed in claim 18, the anode including the metal layer and the transparent conductive layer formed on the metal layer being the first electrode.

* * * * *